(12) United States Patent
Matsumoto et al.

(10) Patent No.: US 9,200,380 B2
(45) Date of Patent: Dec. 1, 2015

(54) SINGLE-CRYSTAL MANUFACTURING METHOD AND SINGLE-CRYSTAL MANUFACTURING APPARATUS

(75) Inventors: Suguru Matsumoto, Nishishirakawa (JP); Susumu Sonokawa, Nishishirakawa (JP); Toshiharu Uesugi, Nishishirakawa (JP); Takashi Mori, Echizen (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 1068 days.

(21) Appl. No.: 13/125,899

(22) PCT Filed: Oct. 19, 2009

(86) PCT No.: PCT/JP2009/005438
§ 371 (c)(1),
(2), (4) Date: Apr. 25, 2011

(87) PCT Pub. No.: WO2010/064356
PCT Pub. Date: Jun. 10, 2010

(65) Prior Publication Data
US 2011/0214605 A1   Sep. 8, 2011

(30) Foreign Application Priority Data
Dec. 4, 2008   (JP) ................... 2008-310088

(51) Int. Cl.
*C30B 15/30* (2006.01)
*C30B 29/06* (2006.01)
*C30B 35/00* (2006.01)

(52) U.S. Cl.
CPC ............... *C30B 29/06* (2013.01); *C30B 15/305* (2013.01); *C30B 35/00* (2013.01); *Y10T 117/1032* (2015.01); *Y10T 117/1072* (2015.01)

(58) Field of Classification Search
CPC ...... C30B 15/305; C30B 29/06; C30B 35/00; Y10T 117/1032

USPC ............ 117/11, 13, 28, 30, 32, 200, 206, 218
See application file for complete search history.

(56) References Cited

U.S. PATENT DOCUMENTS 4,606,037 A * 8/1986 Terashima et al. ................ 373/6
5,792,255 A * 8/1998 Iino et al. ......................... 117/32
(Continued)

FOREIGN PATENT DOCUMENTS

| JP | A-62-256791 | 11/1987 |
| JP | A-8-239292 | 9/1996 |

(Continued)

OTHER PUBLICATIONS

International Preliminary Report on Patentability dated Jul. 14, 2011 in International Application No. PCT/JP2009/005438.

(Continued)

*Primary Examiner* — Matthew Song
(74) *Attorney, Agent, or Firm* — Oliff PLC

(57) ABSTRACT

The present invention provides a silicon single crystal manufacturing method for manufacturing a single crystal based on a horizontal magnetic field applied CZ method for pulling the single crystal while applying a horizontal magnetic field to a silicon raw material melt accommodated in a quartz crucible by a magnetic field application device, comprising: measuring a center position of the magnetic field generated by the magnetic field application device; and deviating the measured center position of the magnetic field from a pulling member serving as a rotation axis of the single crystal in a horizontal direction within the range of 2 to 14 mm before manufacture of the single crystal and/or during manufacture of the single crystal. As a result, the silicon single crystal manufacturing method and manufacturing apparatus that enable manufacture of a single crystal while suppressing fluctuations in diameter and in oxygen concentration without a variation caused due to characteristics of the apparatus can be provided.

3 Claims, 8 Drawing Sheets

(56) References Cited

U.S. PATENT DOCUMENTS

| | | | |
|---|---|---|---|
| 5,851,283 A | 12/1998 | Hoshi et al. | |
| 2003/0079674 A1* | 5/2003 | Tachikawa et al. | ............. 117/30 |

FOREIGN PATENT DOCUMENTS

| | | |
|---|---|---|
| JP | A-8-333191 | 12/1996 |
| JP | A-9-188590 | 7/1997 |
| JP | A-2000-264771 | 9/2000 |
| JP | A-2001-19592 | 1/2001 |

OTHER PUBLICATIONS

International Search Report dated Dec. 28, 2009 in corresponding International Application No. PCT/JP2009/005438.

Sep. 17, 2015 Office Action issued in Korean Application No. 10-2011-7011299.

* cited by examiner (A)

(B)

(C)

(A)

(B)

SINGLE-CRYSTAL MANUFACTURING METHOD AND SINGLE-CRYSTAL MANUFACTURING APPARATUS

TECHNICAL FIELD

The present invention relates to a silicon single crystal manufacturing method based on a horizontal magnetic field applied CZ method (which will be referred to as an "HMCZ method" hereinafter) for pulling up a single crystal from a silicon raw material melt while applying a horizontal magnetic field to the silicon raw material melt in a crucible by a magnetic field application device and to a silicon single crystal manufacturing apparatus for use in this method.

BACKGROUND ART

A fact that the HMCZ method is superior in various points to a regular CZ method (a Czochralski method) is well known. An apparatus for use in implementation of this HMCZ method is obtained by improving an apparatus adopting the regular CZ method and has a configuration that a magnetic field application device for magnetic field application is coaxially arranged on the outside of a heater for heating a quartz crucible to face each other with the quartz crucible sandwiched therebetween.

FIG. 7 is a schematic view showing an example of a manufacturing apparatus used when implementing a silicon single crystal manufacturing method based on the conventional HMCZ method.

This manufacturing apparatus is constituted of a silicon single crystal pulling device 70 and a magnetic field application device 71 arranged on the outside of the pulling device 70. The pulling device 70 includes a hollow cylindrical chamber 80, and a crucible is arranged at a central part of this chamber 80. This crucible has a double structure, and it is constituted of a quartz inner holding container having a bottomed cylindrical shape (which will be simply referred to as a "quartz crucible 75a" hereinafter) and a graphite outer holding container that is adapted to hold the outer side of the quartz crucible 75a and likewise has a bottomed cylindrical shape (a "graphite crucible 75b").

These crucibles are fixed to an upper end portion of a support shaft 76 to allow their rotation and upward and downward movements, and a resistance heating type heater 78 is substantially concentrically arranged on the outside of the crucible. Additionally, a heat insulating material 79 is concentrically arranged at an outer periphery of the heater 78. Further, a silicon raw material with a predetermined weight that has been put into the crucible is molten by the heater 78 to turn to a silicon raw material melt 72.

A pulling wire (or a pulling shaft, and both the members will be generically referred to as a "pulling member 77" hereinafter) that rotates on the same axis as the support shaft 76 in an opposite direction or the same direction at a predetermined rate is arranged on a central axis of the crucible filled with the silicon raw material melt 72, and a seed crystal 74 is held at a lower end of the pulling member 77.

In such a manufacturing apparatus, the silicon raw material is put into the quartz crucible, the silicon raw material is molten in an inert gas atmosphere under a reduced pressure by the heater 78 arranged around the crucible, then the seed crystal 74 held at the lower end of the pulling member 77 is immersed in a surface of the melt, and the pulling member 77 is pulled up while rotating the crucible and the pulling member 77, thereby growing a silicon single crystal 73 at a lower end surface of the seed crystal 74. Further, when growing the silicon single crystal 73, a horizontal magnetic field is applied to the silicon raw material melt 72 by the magnetic field application device 71 coaxially arranged to face the silicon raw material melt 72 to sandwich the quartz crucible 75a therebetween.

As described above, when pulling up a single crystal from the silicon raw material melt in the quartz crucible, according to the HMCZ method, since heat convection of the melt can be suppressed and a fluctuation in temperature near a melt liquid level (a solid-liquid interface temperature of the pulled single crystal) with time is reduced, it is possible to obtain advantages that generation of dislocation or a defect is suppressed and that the silicon single crystal having a uniform and low oxygen concentration can be easily acquired. Furthermore, since the generation of dislocation or a defect is suppressed, even a single crystal having a large diameter can be readily manufactured. Moreover, since the convection is suppressed, it is also possible to obtain an advantage that a crucible wall is hardly degraded.

In the single-crystal manufacturing apparatus adopting the conventional HMCZ method, the central axis of the coil is arranged to coincide with the melt surface in the quartz crucible, thereby suppressing the convection near the melt liquid level and forming the heat convection in a portion below positions near the melt liquid level. In this apparatus, heat transfer to a boundary layer between the single crystal that is being pulled up and the melt is enhanced, a temperature difference between the periphery of the crucible and the boundary layer can be reduced, the melt sufficiently agitated in the portion below the positions near the melt surface is supplied to the boundary layer, and hence it is possible to obtain advantages that the single crystal having uniform characteristics can be obtained as compared with an apparatus adopting the regular CZ method and that a crack in the crucible due to heat stress can be avoided.

Here, with an increase in diameter of a single crystal in recent years, there is a demand of a large silicon single crystal having a diameter of 300 mm or above. With this demand, a silicon raw material having a weight of 300 kg or above must be molten in a large quartz crucible having a diameter of 800 mm or above to grow a silicon single crystal. There has been suggested an HMCZ method for controlling convection of the melt in growth of the silicon single crystal from such a large volume of silicon raw material melt (see, e.g., Patent Document 1). Additionally, in regard to control over an interstitial oxygen concentration of a silicon single crystal grown based on an HMCZ method, an apparatus that a curvature radius of a magnetic field to be applied is specified (see, e.g., Patent Document 2) or a method for setting a relative position of a magnetic field application device and a crucible in the vertical direction (see, e.g., Patent Documents 3 and 4) is disclosed.

However, even if the above-described method or apparatus is utilized to grow the silicon single crystal, control over a diameter of the single crystal or an oxygen concentration in the single crystal in a growth direction is difficult, and the diameter or the oxygen concentration is fluctuated, whereby there occurs a problem that the silicon single crystal cannot be manufactured in conformity to a demanded quality standard and a yield ratio of the silicon single crystal is lowered. Further, there also arises a problem that quality of the manufactured single crystal greatly differs depending on each manufacturing apparatus.

CITATION LIST

Patent Literature

Patent Document 1: Japanese Unexamined Patent Application Publication No. H 8-239292
Patent Document 2: Japanese Unexamined Patent Application Publication No. S 62-256791
Patent Document 3: Japanese Unexamined Patent Application Publication No H 8-333191
Patent Document 4: Japanese Unexamined Patent Application Publication No. H 9-188590

DISCLOSURE OF THE INVENTION

In view of the above-described problems, it is an object of the present invention to provide a silicon single crystal manufacturing method and a silicon single crystal manufacturing apparatus that can manufacture a single crystal while suppressing fluctuations in diameter and in oxygen concentration without a variation due to characteristics of the apparatus.

To achieve this object, according to the present invention, there is provided a silicon single crystal manufacturing method for manufacturing a single crystal based on a horizontal magnetic field applied CZ method for pulling the single crystal while applying a horizontal magnetic field to a silicon raw material melt accommodated in a quartz crucible by a magnetic field application device, comprising: measuring a center position of the magnetic field generated by the magnetic field application device; and deviating the measured center position of the magnetic field from a pulling member serving as a rotation axis of the single crystal in a horizontal direction within the range of 2 to 14 mm before manufacture of the single crystal and/or during manufacture of the single crystal.

When the measured center position of the magnetic field is deviated from the pulling member, a distribution of a magnetic field intensity or a direction of the magnetic field changes, an inhomogeneous field of a temperature distribution in the silicon melt is also deviated, and hence an influence on the growing single crystal by a periodic temperature fluctuation can be eased, whereby the temperature inhomogeneous field deviated from the center is alleviated since it is apt to be affected by convection of the melt. Further, when such a deviation range is set to 2 to 14 mm, a fluctuation in diameter of the single crystal can be effectively suppressed while suppressing a fluctuation in oxygen concentration to fall within an allowable range. Furthermore, according to the present invention, since the center position of the magnetic field is previously measured in accordance with each apparatus and the manufacture is carried out based on this measurement as described above, a variation in quality of the manufactured single crystal due to a variation in characteristics among the apparatuses hardly occurs.

As described above, according to the manufacturing method of the present invention, the high-quality silicon single crystal in which fluctuations in diameter and in the oxygen concentration in growth direction are suppressed can be manufactured with a good yield ratio.

At this time, it is preferable to deviate the measured center position of the magnetic field from the pulling member serving as the rotation axis of the single crystal in the horizontal direction with a ratio of 1 mm or below to a pulling length 10 cm of the single crystal during the manufacture of the single crystal.

When the deviation is realized with such a ratio, the movement of the magnetic field distribution hardly adversely affects the single crystal that is being pulled up, and the single crystal with higher quality can be manufactured.

Moreover, according to the present invention, there is provided a silicon single crystal manufacturing apparatus configured to manufacture a single crystal based on a horizontal magnetic field applied CZ method for pulling the single crystal while applying a horizontal magnetic field to a silicon raw material melt accommodated in a quartz crucible by a magnetic field application device, the apparatus comprising at least: the quartz crucible configured to hold the silicon raw material melt; a pulling member configured to rotate and pull a seed crystal that is immersed in the silicon raw material melt and pulled while growing the single crystal on a lower end surface thereof; and the magnetic field application device coaxially installed to face each other with the quartz crucible sandwiched therebetween in order to apply the horizontal magnetic field to the silicon raw material melt, wherein, the magnetic field application device has a movement mechanism, and a center position of the magnetic field generated by the magnetic field application device is deviated from the pulling member in a horizontal direction within the range of 2 to 14 mm by the movement mechanism before manufacture of the single crystal and/or during manufacture of the single crystal.

According to such a manufacturing apparatus, since the movement mechanism is included, the magnetic field application device can be relatively easily moved, and the magnetic field center can be readily deviated even before the manufacture of the single crystal or during the manufacture of the single crystal. Additionally, when the measured center position of the magnetic field is deviated from the pulling member, since a distribution of a magnetic field intensity or a direction of the magnetic field is changed and an inhomogeneous field of the temperature distribution in the silicon melt is also deviated, an influence on the growing single crystal by a periodic temperature fluctuation can be eased, and the temperature inhomogeneous field deviated from the center is alleviated because it is apt to be affected by convection of the melt. Further, when the deviation range is set to 2 to 14 mm, a fluctuation in diameter of the single crystal can be effectively suppressed while suppressing a fluctuation in oxygen concentration to fall within an allowable range. Furthermore, according to such a manufacturing apparatus of the present invention, since the center position of the magnetic field can be measured in advance and the magnetic field center can be deviated during, e.g., the manufacture, the single crystal can be manufactured while moving the magnetic field application device to an optimum position even during the growth.

As described above, according to the manufacturing apparatus of the present invention, the high-quality silicon single crystal that fluctuations in diameter and in oxygen concentration in the growth direction is hardly observed can be manufactured with a good yield ratio.

At this time, it is preferable to utilize the movement mechanism to deviate the center position of the magnetic field generated by the magnetic field application device from the pulling member in the horizontal direction with a ratio of 1 mm or below to a pulling length 10 cm of the single crystal.

When the deviation is realized with such a ratio, the movement of the magnetic field distribution hardly adversely affects the single crystal that is being pulled up, and the single crystal having higher quality can be manufactured.

As described above, according to the silicon single crystal manufacturing method and manufacturing apparatus of the present invention, the high-quality silicon single crystal that the diameter and the oxygen concentration hardly fluctuate in the growth direction can be manufactured with a good yield ratio.

BEST MODE(S) FOR CARRYING OUT THE INVENTION

Figure 1:
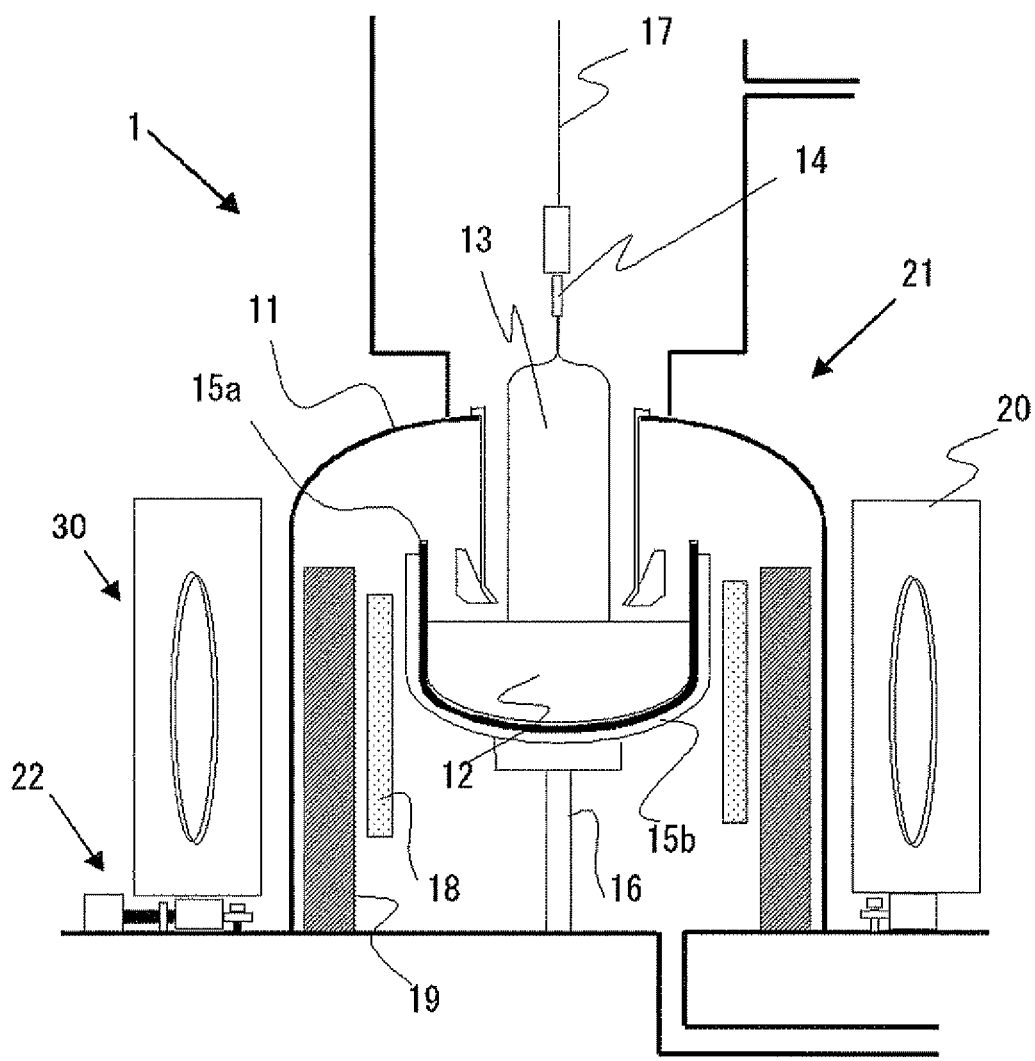
FIG. 1 is a schematic view showing an example of a silicon single crystal manufacturing apparatus according to the present invention.

In conventional examples, manufacture of a silicon single crystal based on the HMCZ method has a problem that a diameter or an oxygen concentration fluctuates in a growth direction of a single crystal and also has a problem that a variation differs depending on each apparatus.

The present inventors examined as described below in view of the above-described problems.

In manufacture of a silicon single crystal manufactured by using the magnetic field application device, since a periodic fluctuation in diameter of the single crystal was different depending on each apparatus, the center of a magnetic field actually produced from the magnetic field application device was measured for examination.

As a result of the measurement, it was discovered that a periodic fluctuation in diameter is large in a apparatus installed at a position where a magnetic field center position substantially conforms with a rotation axis of a silicon melt (a pulling axis of the single crystal) whereas a fluctuation in diameter is small in a apparatus installed at a position where the same does not conform with the rotation axis.

In conventional examples, the apparatus is installed in such a manner that the magnetic field center position conforms with the pulling axis of the single crystal. Further, as a method for achieving this conformation, for example, the magnetic field application device, a crucible, and others are installed in such a manner that the magnetic field center position conforms with the pulling axis of the single crystal by adjusting a positional relationship between these devices, but it was revealed that the fluctuation in diameter is actually small when these positions deviate from each other.

It can be considered that the periodic fluctuation in diameter occurs due to uneven properties of a temperature generated in a melt. Although a magnetic field is applied fundamentally for the purpose of suppressing heat convection of the melt, it can be considered that a distribution of the temperature once generated tends not to become uniform as a result of suppression of the heat convection.

Therefore, it was discovered that a distribution of a magnetic field intensity or a direction of the magnetic field changes and an inhomogeneous field in the temperature distribution also deviates from the center at the same time by deviating the pulling axis and the magnetic field center position from each other rather than conforming them with each other like the conventional examples, an influence of the periodic temperature fluctuation on a growing crystal can be alleviated, and the temperature inhomogeneous field itself deviating from the center can be also eased by forced convection based on crucible rotation or crystal rotation.

Furthermore, since an oxygen concentration of the growing single crystal may fluctuate due to the uneven temperature distribution, this fluctuation in oxygen concentration can be solved by deviating the pulling axis from the magnetic field center position but, by contrast, it was revealed that the fluctuation in oxygen concentration increases when the center position of the magnetic field is deviated too much.

Figure 3:
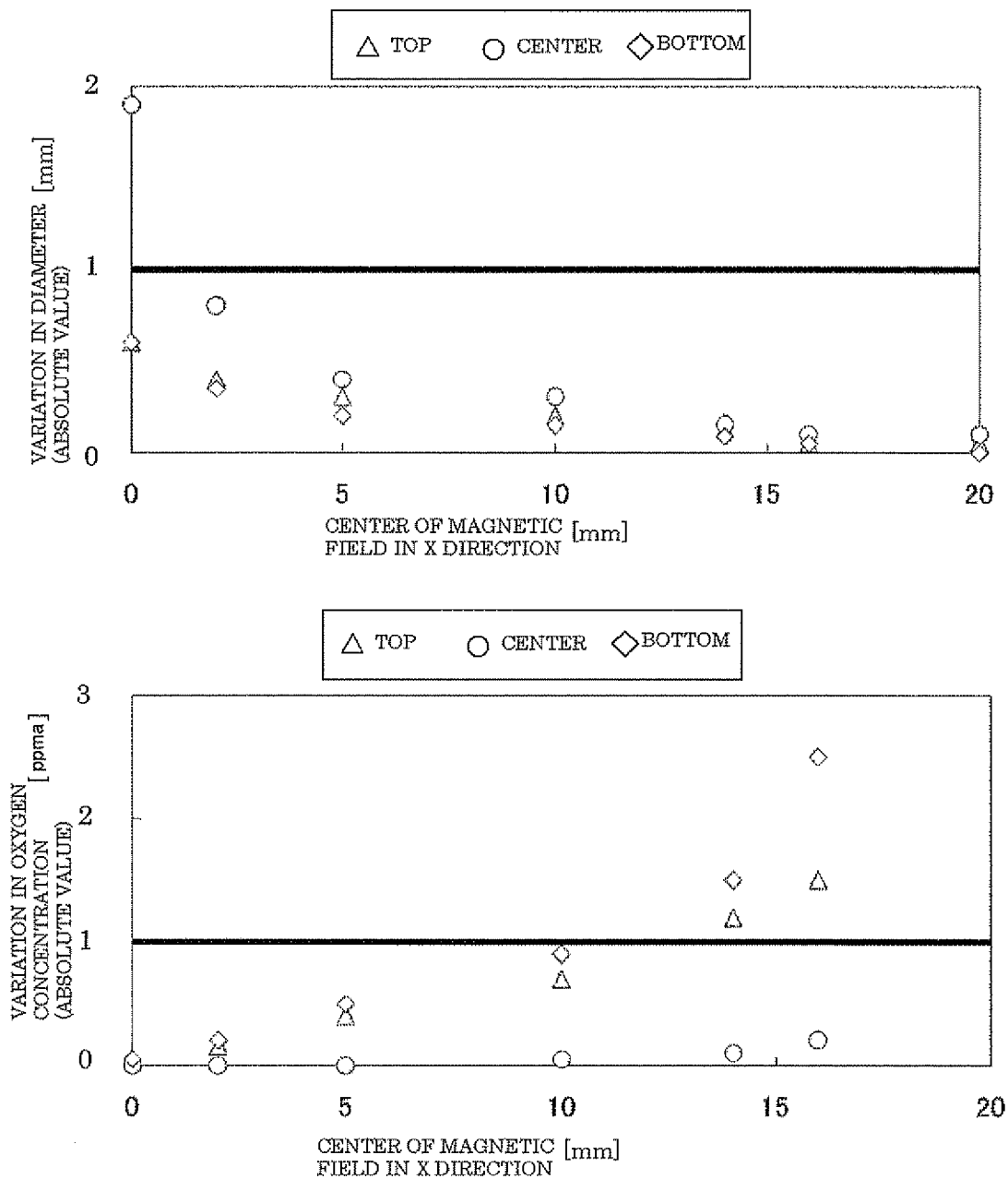
FIG. 3 is a graph showing a relationship between a location of a magnetic field center position in an X direction (a left-and-right direction) from a pulling member, a variation in diameter of a single crystal, and a variation in oxygen concentration of the same.

The present inventors deviated the pulling axis from the magnetic field center position by 0 to 20 mm to left and right sides (an X direction) and front and back sides (a Y direction) when the magnetic field application device is seen from the front face, and they checked a diameter and an oxygen concentration on each of a growth initial stage (a top), a growth middle stage (a center), and a growth later stage (a bottom) of a straight body of a single crystal to be grown. FIG. 3 (when deviated in the X direction) and FIG. 4 (when deviated in the Y direction) show measurement results.

Figure 4:
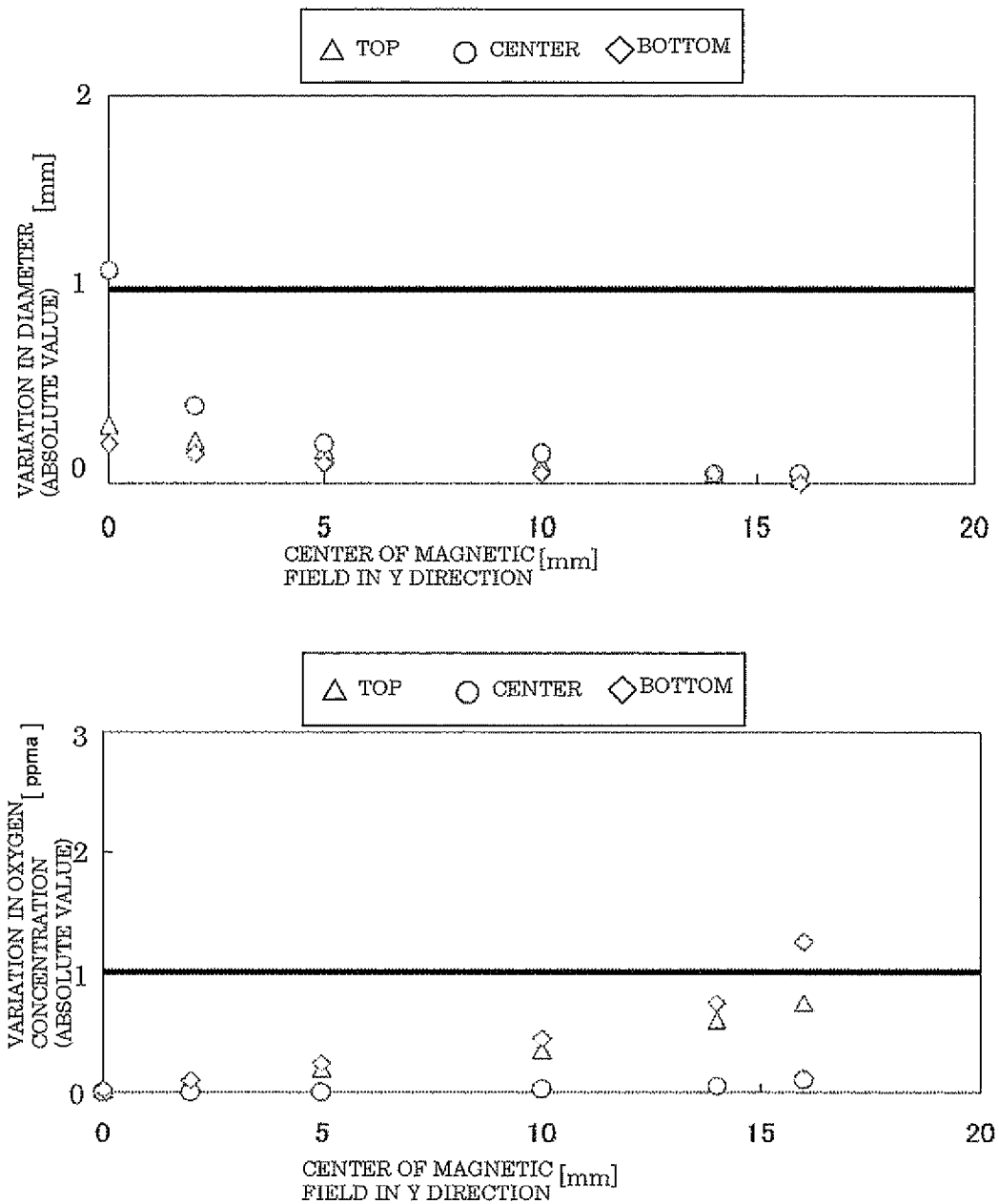
FIG. 4 is a graph showing a relationship between a location of the magnetic field center position in a Y direction (a front-and-back direction) from the pulling member, a variation in diameter of the single crystal, and a variation in oxygen concentration of the same.

As shown in FIGS. 3 and 4, a fluctuation in diameter is effectively suppressed by deviating 2 mm or above, but a variation in oxygen concentration increases when a deviation distance exceeds 14 mm, and the variation exceeds an allowable range in some cases.

Based on the above-described examination, it was discovered that a fluctuation in diameter and a fluctuation in oxygen concentration can be suppressed to fall within the allowable ranges by deviating the center position of a magnetic field and the pulling axis of the single crystal within the range of 2 mm to 14 mm.

Further, the present inventors also found out that a center position of a magnetic field actually generated by the device must be measured in advance and adjusted for accurate adjustment in the above-described ranges and a variation among the apparatuses can be thereby avoided, thus bringing the present invention to completion.

Although the silicon single crystal manufacturing method and manufacturing apparatus according to the present invention will now be described hereinafter in detail as an embodiment with reference to the drawings, the present invention is not restricted thereto.

Figure 2:
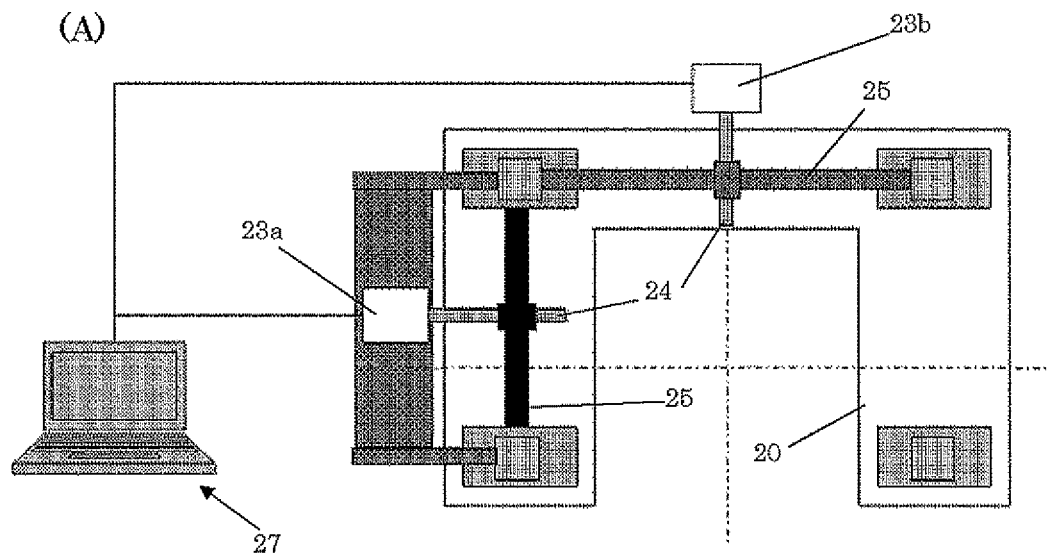
FIG. 2 is a schematic view showing an example of a movement mechanism of a magnetic field application device in the silicon single crystal manufacturing apparatus according to the present invention.
Figure 2:
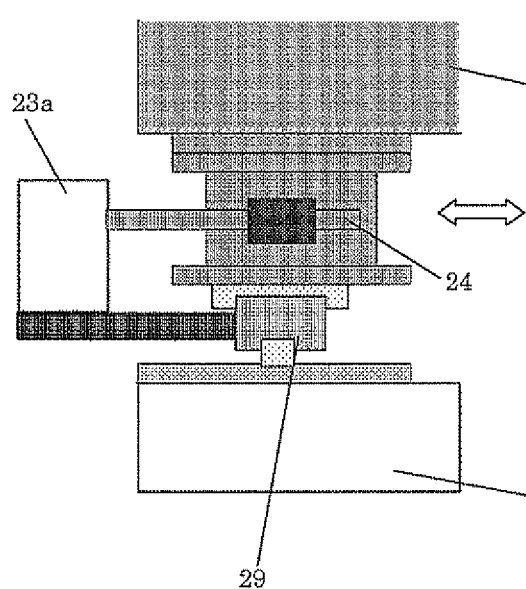
Figure 2:
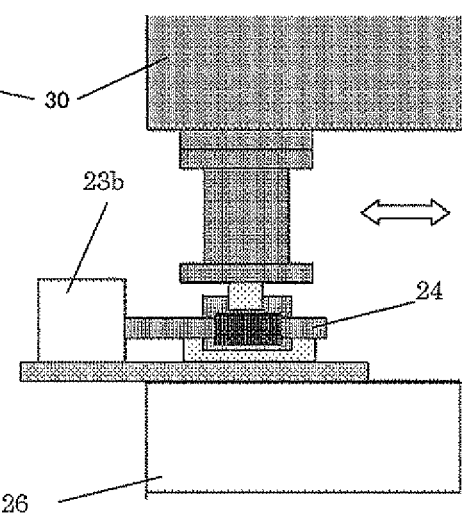
Figure 6:
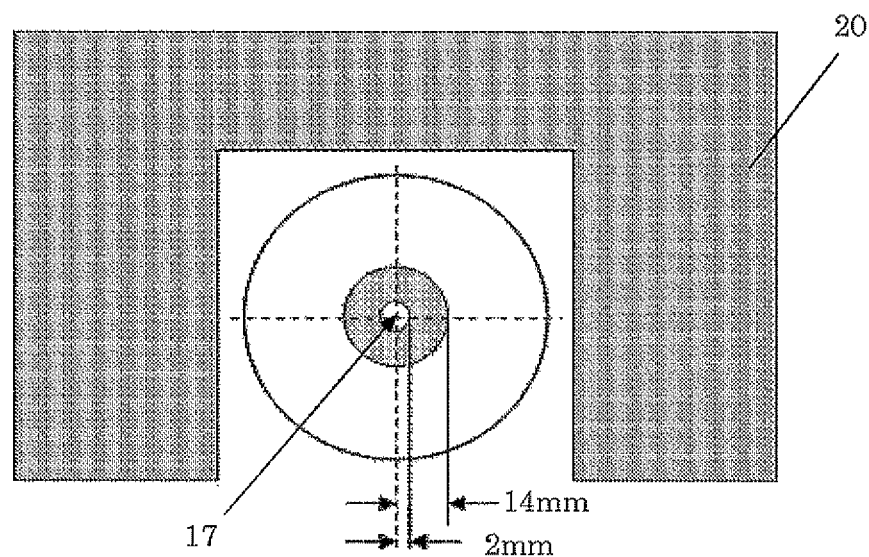
FIG. 6 is a schematic view showing the range in which a magnetic field center is deviated from a pulling axis of the single crystal.
Figure 7:
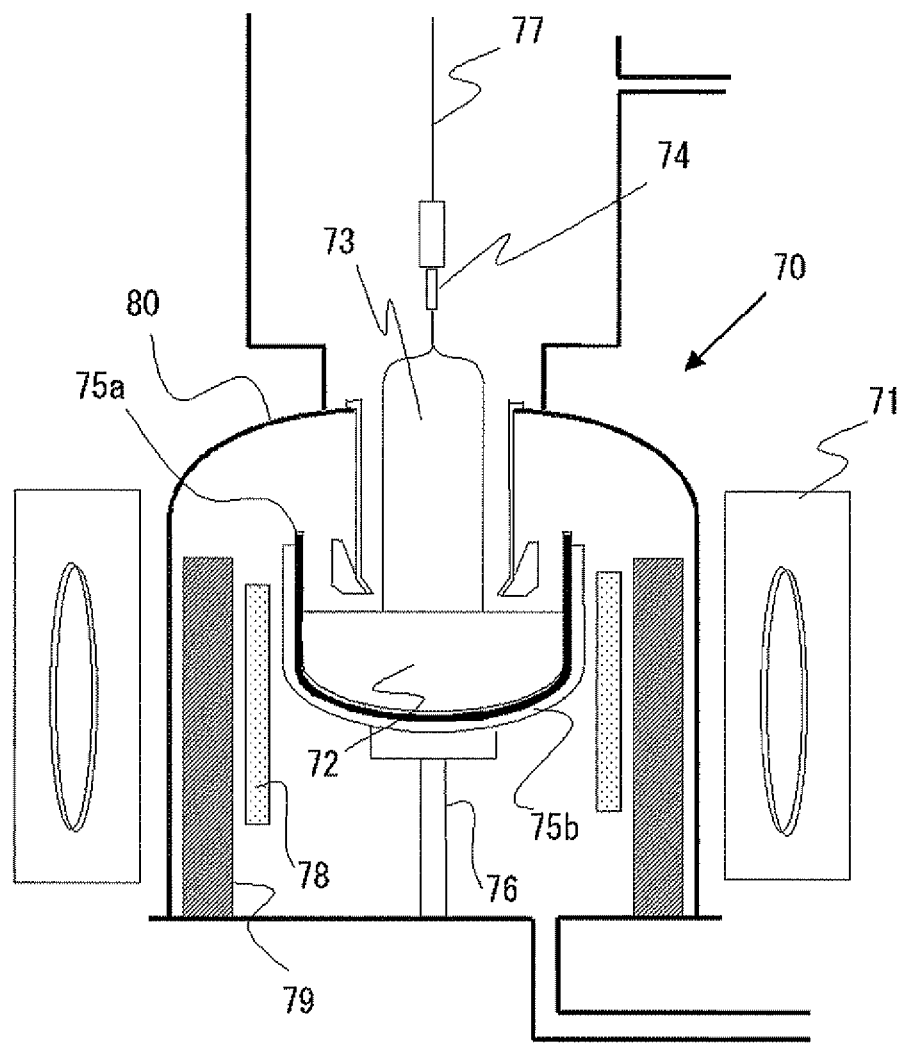
FIG. 7 is a schematic view showing a conventional silicon single crystal manufacturing apparatus.

FIG. 1 is a schematic view showing an example of an embodiment of the silicon single crystal manufacturing apparatus according to the present invention. FIG. 2 is a schematic view showing an example of a movement mechanism in a magnetic field application device according to the present invention. FIG. 6 is a schematic view showing the range of 2 to 14 mm around a pulling axis for a single crystal.

As shown in FIG. 1, a silicon single crystal manufacturing apparatus 1 according to the present invention is constituted of a silicon single crystal pulling device 21 and a magnetic field application device 20 coaxially arranged on an outer side of the pulling device to face each other with a quartz crucible sandwiched therebetween in order to apply a horizontal magnetic field to the silicon raw material melt.

The pulling device 21 includes a hollow cylindrical chamber 11, and a crucible is arranged at a central part thereof. This crucible has a double structure, and it is constituted of a quartz inner holding container having a bottomed cylindrical shape (which will be simply referred to as a "quartz crucible 15a" hereinafter) and a graphite outer holding container (a "graphite crucible 15b") that is adapted to hold the outer side of the quartz crucible 15a and likewise has a bottomed cylindrical shape.

These crucibles are fixed to an upper end portion of a support shaft 16 to enable rotation and upward/downward movements, and a resistance heating type heater 18 is substantially concentrically arranged on the outer side of the crucible. Furthermore, a heat insulating material 19 is concentrically arranged at the periphery of the outer side of the heater 18. Moreover, a silicon raw material having a predetermined weight put in the crucible is molten by the heater 18 to turn to a silicon raw material melt 12.

A pulling wire (or a pulling shaft, and both the members will be generically referred to as a "pulling member 17" hereinafter) that rotates in an opposite direction or the same direction on the same axis as the support shaft 16 at a predetermined rate is arranged at a central axis of the crucible filled with the silicon raw material melt 12, and a seed crystal 14 is held at a lower end of the pulling member 17. Additionally, a silicon single crystal 13 is formed on a lower end surface of the seed crystal 14.

Further, for example, as shown in FIG. 1, in the silicon single crystal manufacturing apparatus according to the present invention, since the magnetic field application device 20 arranged on the outer side of the pulling device 21 has a movement mechanism 22, the magnetic field application device 20 can be moved in a transverse direction and a front-and-back direction.

As the movement mechanism 20, for example, as shown in FIG. 2, ball screws 24 are disposed to a driving motor 23a for left-and-right movement (FIG. 2(B)) and a driving motor 23b for front-and-back movement (FIG. 2(C)), coupling rods 25 are disposed to the ball screws 24, these members are attached to a magnetic field generation member 30 and a lower frame 26, and the driving motors 23a and b are operated by a control device 27 as depicted in FIG. 2(A) to move a predetermined distance the magnetic field application device 20 on an LM guide 29 that can move in the X direction and the Y direction.

In conventional examples, since the pulling member is arranged to coincide with a center position of a magnetic field to manufacture a single crystal, just adjusting a positional relationship between the devices and fixing them at the time of first installation can suffice, and a movement mechanism like the present invention is not required. However, in the manufacturing apparatus according to the present invention, since performing adjustment before manufacture of the single crystal is easy and the magnetic field application device can be moved during manufacture of the single crystal in particular, the manufacturing apparatus is preferable for use in the manufacturing method according to the present invention.

The above-described manufacturing apparatus according to the present invention can be used to carry out the silicon single crystal manufacturing method according to the present invention characterized in that a center position of a magnetic field generated by the magnetic field application device 20 is measured and the measured center position of the magnetic field is deviated from the pulling member 17 serving as a rotation axis of the single crystal 13 in the horizontal direction within the range of 2 to 14 mm before manufacture of the single crystal and/or during manufacture of the single crystal.

It is to be noted that, since the deviation range corresponds to the horizontal direction, this range is not restricted to the front, back, left, and right directions, and the deviation can be performed in a doughnut-like range that is a shaded area around the pulling member 17 as shown in FIG. 6.

As described above, when the measured center position of the magnetic field is deviated from the pulling member, since a distribution of a magnetic field intensity or a direction of the magnetic field change and an inhomogeneous field of a temperature distribution in the silicon melt is also deviated, an influence of a periodic temperature fluctuation on the growing single crystal can be eased, and the temperature inhomogeneous field deviated from the center is apt to be affected by convection of the melt and hence alleviated. Furthermore, setting such a deviation range to 2 to 14 mm enables effectively suppressing a fluctuation in diameter of the single crystal while suppressing a fluctuation in oxygen concentration within an allowable range. Moreover, in the present invention, since the center position of the magnetic field is measured in accordance with each apparatus in advance and manufacture is carried out based on the measured position as described above, quality of the single crystals manufactured by the respective apparatuses hardly varies.

In the manufacturing method according to the present invention, although a method of measuring the center position of the magnetic field generated by the magnetic field application device 20 is not restricted in particular, there is, e.g., a measurement method of using an aluminum plate and moving a sensor on the aluminum plate.

Figure 5:
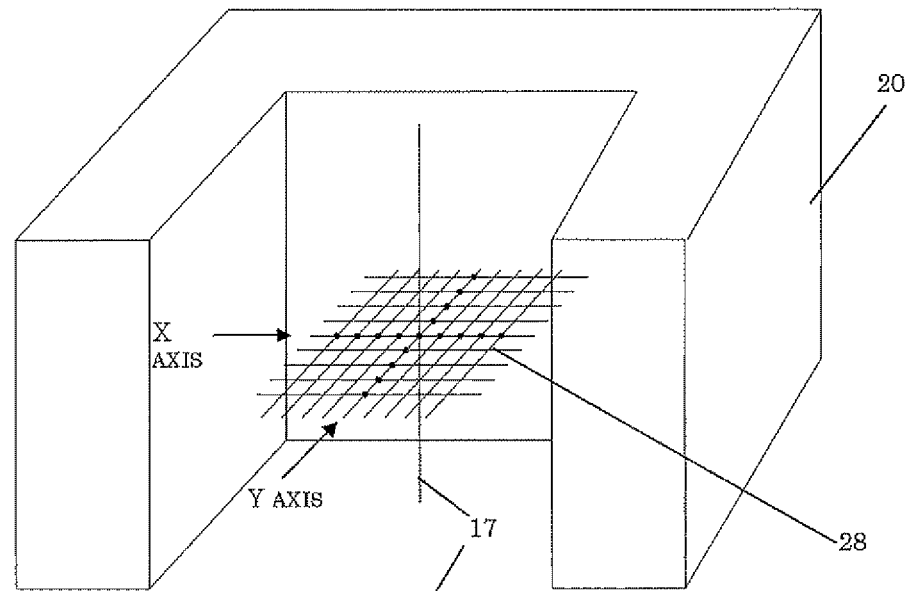
FIG. 5 is explanatory views for explaining a method for measuring a center position of a magnetic field generated from the magnetic field application device ((A) is a perspective view, and (B) is a side view)
Figure 5:
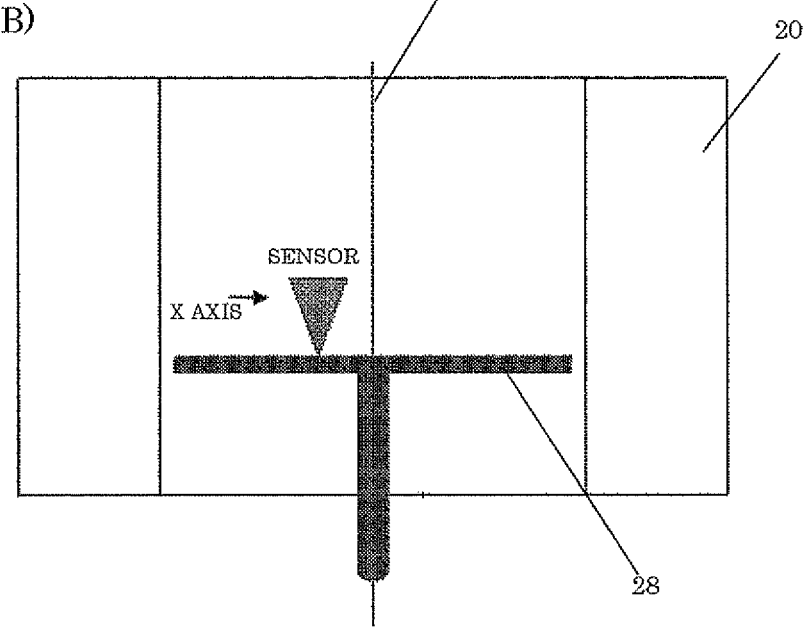

FIG. 5 are a perspective view (A) and a side view (B) schematically showing a method for measuring a center position of a magnetic field according to the present invention. For example, a position of the pulling member 17 is determined as the center, a magnetic field measurement jig (an aluminum plate) 28 having a measurement pitch of 50 mm (a 90-cm-square jig in which holes are formed at equal intervals of 50 mm so that a magnetic field gauge head (a sensor) can be set) is installed, a magnetic field is applied by the magnetic field application device 20, a left-and-right direction is determined as an X axis and a front-and-back direction is determined as a Y axis when the magnetic field application device 20 is seen from the front face, and an intensity of the magnetic field at each point is measured by a gauss meter. Further, a quadratic curve is calculated from a measurement result by utilizing characteristics that a magnetic field distribution describes a parabola that is the lowest at the center of the X axis and the highest at the center of the Y axis, thereby deriving a center position of the magnetic field.

Furthermore, the thus measured center position of the magnetic field is deviated from the pulling member 17 in the range of 2 to 14 mm. As a timing for this deviation, the center position may be previously fixed at a predetermined deviation position before manufacture of the single crystal to carry out manufacture, it may be deviated during manufacture of the single crystal, or it may be deviated before manufacture and further appropriately deviated during manufacture. Moreover, it is preferable to previously confirm a position that is effective for suppression of a fluctuation in diameter or a fluctuation in oxygen concentration in accordance with each utilized apparatus.

In particular, when the center position of the magnetic field is considerably deviated, the variation in oxygen concentration of the single crystal to be grown greatly fluctuates, namely, the fluctuation in oxygen concentration is low on an initial stage of growth and high on a later stage of growth. Therefore, a single crystal with higher quality can be manufactured by, e.g., slightly deviating (5 mm) the center position on the initial stage of growth, greatly deviating (14 mm) the same on a middle stage of growth to suppress a fluctuation in diameter, and again slightly deviating (5 mm) the same on the later stage of growth.

At this time, although a speed (e.g., a movement rate of the magnetic field application device) for deviating the measured center position of the magnetic field from the pulling member serving as the rotation axis for the single crystal in the horizontal direction is not restricted in particular, deviating with a ratio of 1 mm or below to a pulling length 10 cm of the single crystal is preferable.

When deviation is performed with such a ratio, the single crystal that is being pulled is hardly adversely affected by movement of the magnetic field distribution, and the single crystal with higher quality can be manufactured.

As described above, according to the silicon single crystal manufacturing method and manufacturing apparatus of the present invention, the silicon single crystal with higher quality in which fluctuations in diameter and in oxygen concentration in the growth direction are hardly observed can be manufactured with a good yield ratio.

It is to be noted that, when carrying out the silicon single crystal manufacturing method according to the present invention, an apparatus to be used is not restricted in particular, and conventional apparatuses other than the silicon single crystal manufacturing apparatus according to the present invention can likewise carry out the manufacturing method according to the present invention by, for example, moving the magnetic field application device to a predetermined deviation position and again fixing the magnetic field application device before manufacture of a single crystal.

Although the present invention will now be more specifically described based on examples and a comparative example, the present invention is not restricted to these examples.

EXAMPLE 1

The manufacturing apparatus shown in FIG. 1 was utilized to manufacture a silicon single crystal having a diameter of 8 inches (200 mm) from a silicon melt of 200 kg. An intensity of a magnetic field generated from a magnetic field application device was set to 4000 gauss (0.4 T).

At this time, a center position of the magnetic field generated from the magnetic field application device was measured in advance as described above. Additionally, to set movement conditions for the magnetic field application device, a center position of the magnetic field on an initial stage after installation of the device was measured in advance, and the magnetic field application device was moved in the range of 2 to 14 mm to confirm a deviation position that is effective for suppression of a fluctuation in diameter and a fluctuation in oxygen concentration.

Then, the measured magnetic field center and a pulling member were deviated from a state, in which they were deviated 5 mm in an X (left-and-right) direction before manufacture of the single crystal, to 14 mm over a middle stage of growth with a ratio of 1 mm to a pulling length 10 cm of the single crystal, and a deviation distance was restored to 5 mm on a later stage of growth to manufacture the single crystal. A scale was disposed to a movement mechanism, and manufacture was performed while confirming whether the magnetic field application device was moving under the set conditions.

Further, a single crystal was manufactured in the same way as the above description except for setting the deviating direction to a Y (front-and-back) direction.

EXAMPLE 2

The apparatus shown in FIG. 1 was utilized to manufacture a silicon single crystal having a diameter of 8 inches (200 mm) from a silicon melt of 200 kg. An intensity of a magnetic field generated from a magnetic field application device was set to 4000 gauss (0.4 T).

At this time, a center position of the magnetic field generated from the magnetic field application device was measured in advance as described above. Furthermore, the measured magnetic center and a pulling member were fixed to a state that they were deviated 5 mm in the X (left-and-right) direction before manufacture of the single crystal to manufacture the single crystal.

Further, a single crystal was manufactured in the same way as the above description except for setting the deviating direction to a Y (front-and-back) direction.

COMPARATIVE EXAMPLE

A conventional manufacturing apparatus was utilized to manufacture a silicon single crystal having a diameter of 8 inches (200 mm) from a silicon melt of 200 kg. An intensity of a magnetic field generated from a magnetic field application device was set to 4000 gauss (0.4 T). This single-crystal manufacturing process was carried out twice.

At this time, in the magnetic field application device, like conventional examples, respective devices were individually installed in two times of the manufacture in such a manner that the center of the magnetic field can coincide with a pulling member by adjusting a positional relationship between the devices, thereby manufacturing each single crystal. At this time, as a result of measuring the center of the actually generated magnetic field and a position of the pulling member in the X direction and the Y direction, deviation of approximately 0.5 mm in the X direction occurred in the first manufacture, and deviation of approximately 1 mm in the Y direction occurred in the second manufacture.

Figure 8:
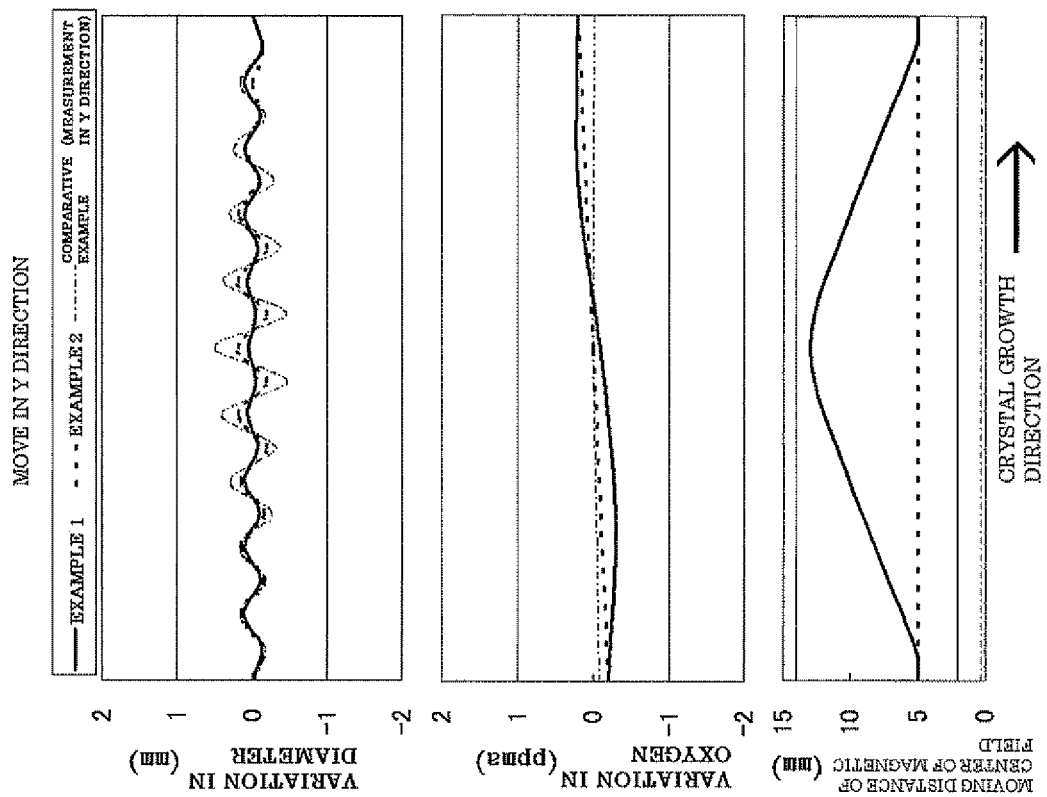
FIG. 8 is graphs showing a fluctuation in diameter of a single crystal, a variation in oxygen concentration, and a center position of a magnetic field from the pulling member in each of Examples 1 and 2 and Comparative Example.
Figure 8:
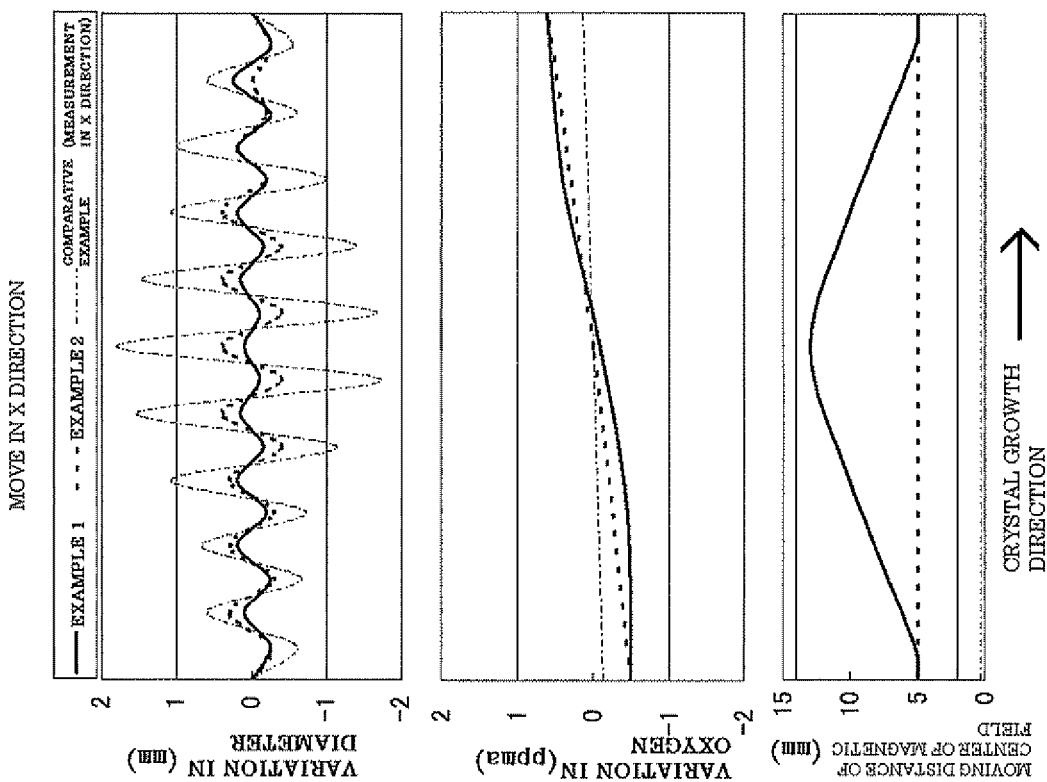

FIG. 8 shows results of measuring a fluctuation in diameter and an oxygen concentration in the silicon single crystal manufactured in each of Examples 1 and 2 and Comparative Example.

As can be understood from FIG. 8, adopting the manufacturing method and the manufacturing apparatus according to the present invention enables effectively suppressing the fluctuation in diameter in the growth direction of the single crystal to fall within the target range of ±1 mm and also enables suppressing the fluctuation in oxygen concentration to fall within the allowable range.

It is to be noted that the present invention is not restricted to the foregoing embodiment. The foregoing embodiment is just an exemplification, and any examples that have substantially the same configurations and exercise the same functions and effects as the technical concept described in claims of the present invention are included in the technical scope of the present invention.

The invention claimed is:

1. A silicon single crystal manufacturing method for manufacturing a single crystal based on a horizontal magnetic field applied CZ method for pulling the single crystal while applying a magnetic field consisting essentially of a horizontal magnetic field to a silicon raw material melt accommodated in a quartz crucible by a magnetic field application device, comprising:

measuring a center position of the magnetic field consisting essentially of a horizontal magnetic field generated by the magnetic field application device; and deviating the measured center position of the magnetic field consisting essentially of a horizontal magnetic field from a pulling member serving as a rotation axis of the single crystal in a horizontal direction within the range of 2 to 14 mm during manufacture of the single crystal or before manufacture of the single crystal and during manufacture of the single crystal.

2. The silicon single crystal manufacturing method according to claim 1, wherein the measured center position of the magnetic field is deviated from the pulling member serving as the rotation axis of the single crystal in the horizontal direction with a ratio of 1 mm or below to a pulling length 10 cm of the single crystal during the manufacture of the single crystal.

3. The silicon single crystal manufacturing method according to claim 1, wherein a center position of the magnetic field consisting essentially of a horizontal magnetic field during a middle stage of the growth of the single crystal is deviated more than a center position of the magnetic field during an initial stage of growth of the single crystal and a center position of the magnetic field during a later stage of growth of the single crystal when deviating the measured center position of the magnetic field from the pulling member serving as the rotation axis of the single crystal in a horizontal direction within the range of 2 to 14 mm during manufacture of the single crystal.

* * * * *